(12) United States Patent
Goto et al.

(10) Patent No.: US 11,710,671 B2
(45) Date of Patent: Jul. 25, 2023

(54) SEMICONDUCTOR MODULE (71) Applicant: Mitsubishi Electric Corporation, Tokyo (JP)

(72) Inventors: Ryo Goto, Tokyo (JP); Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 63 days.

(21) Appl. No.: 17/455,114

(22) Filed: Nov. 16, 2021

(65) Prior Publication Data
US 2022/0230929 A1   Jul. 21, 2022

(30) Foreign Application Priority Data

Jan. 20, 2021   (JP) .................. 2021-007132

(51) Int. Cl.
*H01L 25/07* (2006.01)
*H01L 23/049* (2006.01)
*H01L 23/00* (2006.01)
*H01L 23/373* (2006.01)

(52) U.S. Cl.
CPC ........ *H01L 23/049* (2013.01); *H01L 23/3735* (2013.01); *H01L 24/32* (2013.01); *H01L 25/072* (2013.01); *H01L 2224/32225* (2013.01); *H01L 2924/10272* (2013.01); *H01L 2924/13055* (2013.01); *H01L 2924/1715* (2013.01); *H01L 2924/30107* (2013.01)

(58) Field of Classification Search
CPC ... H01L 23/049; H01L 23/3735; H01L 24/32; H01L 25/072; H01L 2224/32225; H01L 2924/10272; H01L 2924/13055; H01L 2924/1715; H01L 2924/30107; H01L 21/50; H01L 23/49811; H01L 23/645; H01L 24/29; H01L 2224/29101; H01L 23/04; H01L 23/053; H01L 23/62
See application file for complete search history.

(56) References Cited

U.S. PATENT DOCUMENTS 5,471,089 A   11/1995   Nagatomo et al.

FOREIGN PATENT DOCUMENTS

JP   H06-021323 A   1/1994

*Primary Examiner* — Elias Ullah
(74) *Attorney, Agent, or Firm* — Studebaker & Brackett PC (57) ABSTRACT A semiconductor module includes a semiconductor element, a substrate on which the semiconductor module is mounted, a heat radiating plate on which the substrate is mounted, a resin case, and a first main current electrode and a second main current electrode, in which in the first main current electrode and the second main current electrode, one end of each thereof is joined to a circuit pattern on the substrate, an other end of each thereof is extended through and incorporated in a side wall of the resin case so as to project outward of the resin case, and each thereof has at least a portion of overlap at which a part thereof overlaps in parallel with each other with a gap therebetween, and each thereof has a slope portion provided between an external projection portion and an internal projection portion.

9 Claims, 12 Drawing Sheets

SEMICONDUCTOR MODULE

BACKGROUND OF THE INVENTION

Field of the Invention

The present disclosure relates to a semiconductor module, and more particularly to a semiconductor module having an electrode structure that reduces an inductance.

Description of the Background Art

Figure 1:
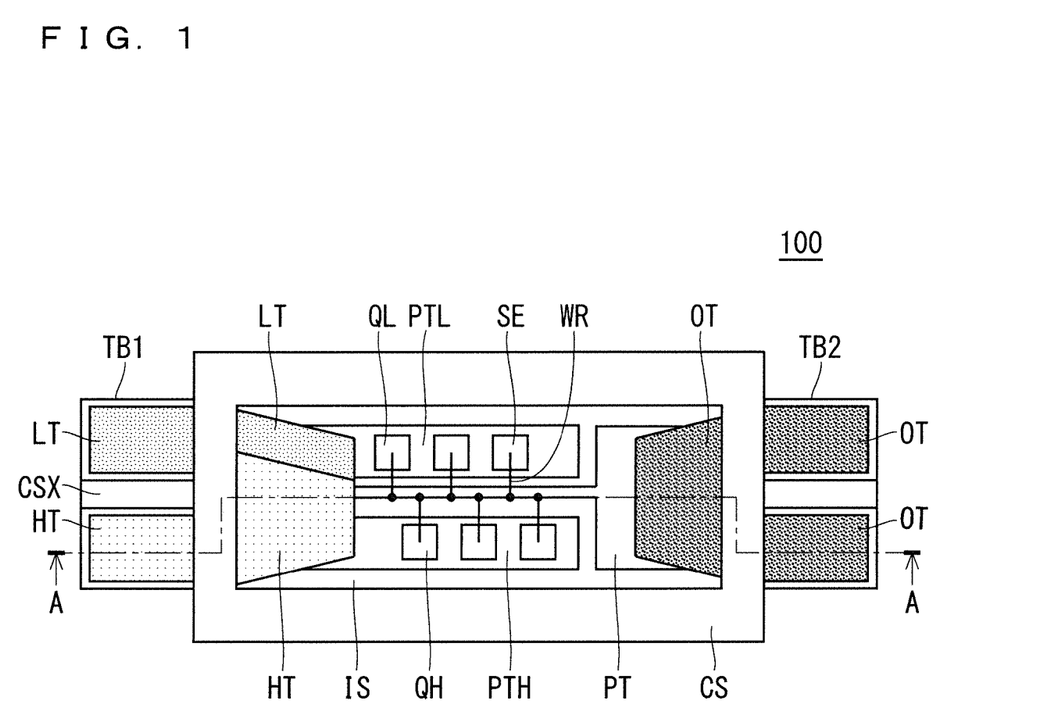
FIG. 1 is a plan view illustrating a configuration of a semiconductor module according to Embodiment 1.

Conventionally, as an electrode structure for suppressing a surge voltage on a power supply line of a semiconductor module, a structure disclosed in FIG. 1 of Japanese Patent Application Laid-Open No. 6-21323 has been proposed. In FIG. 1, two power supply terminals composed of plate-shaped conductors are provided close to each other with an insulating sheet having a thickness of 0.5 mm to 1.5 mm interposed therebetween. The currents flowing through the terminals are antiparallel to each other. It is disclosed that this lowers the inductance formed parasitically on the path formed by the two power supply terminals and the semiconductor element and lowers the surge voltage as well.

The electrode structure of Japanese Patent Application Laid-Open No. 6-21323 has a structure in which the parallel plate electrode has a plurality of right-angled portions; therefore, the path length for the current becomes long and the inductance of the electrode is raised, potentially breaking the semiconductor element due to the surge voltage occurring during the high-speed switching operation of the semiconductor element.

Further, a thick conductive material cannot be used due to the difficulty in processing thereof because of those many right-angled portions, this increases the current density in the electrode, leading to a higher inductance. Here, the relationship of $\Delta V = Ls \times di/dt$ between the surge voltage ($\Delta V$) and the inductance (Ls) generated during the turn-off switching of the switching element. The allowable surge voltage is fixed; therefore, the inductance and the current change rate (di/dt) are in a contradictory relationship. When the inductance (Ls) is larger, the reduction in the switching speed or the current value is required in order to reduce the current change rate (di/dt). When high-speed switching is required, the allowable current value is to be lowered, limiting the current capacity. Although the effective way to reduce the inductance is to reduce the current density of the electrodes, this will lead to a wider electrode when the electrodes cannot be made thicker, having posed the problem of difficulty in the miniaturization of the semiconductor module.

SUMMARY

An object of the present disclosure is to provide a semiconductor module which, by adopting an electrode structure having a low inductance, suppresses a surge voltage even during high-speed switching operation of a switching element and miniaturization thereof is ensured.

According to the present disclosure, the semiconductor module includes a semiconductor element, a substrate on which the semiconductor module is mounted, a heat radiating plate on which the substrate is mounted, a resin case accommodating the substrate and the semiconductor element, and a first main current electrode and a second main current electrode through which a main current of the semiconductor element flows, in which in the first main current electrode and the second main current electrode, one end of each thereof is joined to a circuit pattern on the substrate, an other end of each thereof is extended through and incorporated in a side wall of the resin case so as to project outward of the resin case, and each thereof has at least a portion of overlap at which a part thereof overlaps in parallel with each other with a gap therebetween, and each thereof has a slope portion provided between an external projection portion with each thereof projecting outward from the resin case and an internal projection portion with each thereof projecting inward from the resin ease.

According to the semiconductor module, the first main current electrode and the second main current electrode each have an overlapping portion in which at least a part thereof overlaps in parallel with each other with a gap therebetween, self-inductance can be reduced by mutual induction. Also, the first main current electrode and the second main current electrode each have slope portion, the electrode path can be shortened and the inductance can be further reduced. By lowering the inductance, when the semiconductor element is a switching element, the surge voltage can be suppressed even during high-speed switching operation. Having the slope portion allows the use of an electrode material having the good workability and a thick thickness; therefore, the current density of the electrode is lowered, and the semiconductor module can be miniaturized.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

FIG. 1 is a plan view illustrating a configuration of a semiconductor module 100 according to Embodiment 1 and the upper surface of a resin case CS is omitted in order to clarify the internal configuration thereof. Further, FIG. 2 is a cross-sectional view illustrating the configuration of the semiconductor module 100, and is a cross-sectional view taken along the line A-A in FIG. 1 in the direction indicated by the arrows.

Figure 2:
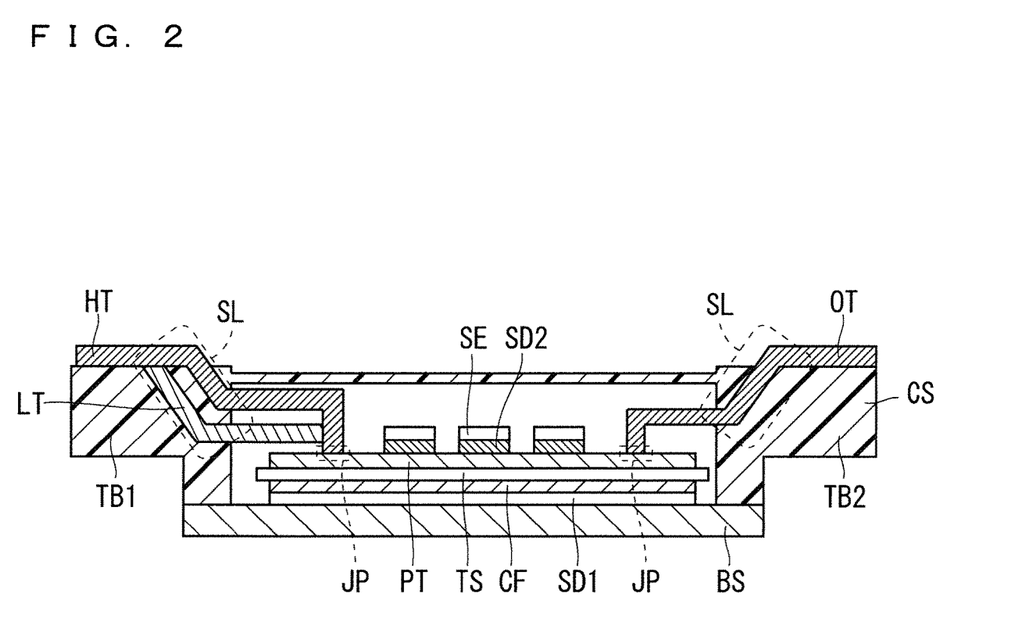
FIG. 2 is a cross-sectional view illustrating the configuration of the semiconductor module according to Embodiment 1.

As illustrated in FIGS. 1 and 2, in the semiconductor module 100, the upper surface of a base plate BS that functions as a heat radiating plate and a conductor film CF on the lower surface of an insulating substrate IS are bonded via a bonding material SD1 such as a solder material. A circuit pattern PT is provided on the upper surface of the insulating substrate IS, and a plurality of semiconductor elements SE such as transistor chips for electric power and diode chips are bonded on the circuit pattern PT via a bonding material SD2 such as a solder material.

The insulating substrate IS is made of a resin or a ceramic material and the base plate BS is made of a material having excellent heat radiation property such as aluminum (Al) or copper (Cu).

The insulating substrate IS mounted on the base plate BS is accommodated in a box-shaped resin case CS mounted on the base plate BS and sealed with a resin or the like, and the illustration thereof is omitted for convenience.

In FIGS. 1 and 2, a transistor constituting an inverter, for example, an Insulated Gate Bipolar Transistor (IGBT), is illustrated as an example of the semiconductor element SE, and in FIG. 1, a plurality of high-side transistors QH mounted on a circuit pattern PTH connected to a high potential electrode HT high in potential and a plurality of low-side transistors QL mounted on a circuit pattern PTL connected to a low potential electrode LT low in potential are electrically connected to the circuit pattern PT via a wire WR. An electric circuit provided on the insulating substrate IS is not limited to the inverter.

As illustrated in FIG. 1, the circuit pattern PT is provided between the elongated circuit pattern PTH and the circuit pattern PTL in plan view, extended to the end portion of the insulating substrate IS being on a side opposite to the side provided with the high potential electrode HT and the low potential electrode LT in plan view, and connected to an output electrode OT at the end portion of the insulating substrate IS. The high potential electrode HT and the low potential electrode LT can be referred to as a first main current electrode and a second main current electrode through which the main current of the semiconductor elements SE flows, respectively.

As illustrated in FIG. 1, the high potential electrode HT and the low potential electrode LT are incorporated into one side wall in the longitudinal direction of the resin case CS rectangular in a plan view, and one ends thereof are exposed on the upper surface of a terminal block TB 1 projecting outward from the side wall and the other ends are bonded to the circuit pattern PTH and the circuit pattern PTL, respectively. The high potential electrode HT and the low potential electrode LT are arranged to be in parallel and close to each other and portions thereof overlap each other; therefore, the self-inductance of the semiconductor module 100 can be reduced by mutual induction. Further, as illustrated in FIG. 2, the high potential electrode HT and the low potential electrode LT have a slope portion SL bent at an angle of less than 90° with respect to the horizontal direction parallel to the base plate BS, this allows having a shorter electrode length compared with the case when bent perpendicular to the horizontal direction parallel to the base plate BS, further lowering the inductance of the semiconductor module 100.

Further, as illustrated in FIG. 1, the output electrode OT is incorporated in the other side wall in the longitudinal direction of the resin case CS, and one end thereof is exposed on the upper surface of a terminal block TB2 projecting outward from the side wall, and the other end is connected to the circuit pattern PT.

As illustrated in FIG. 2, a junction portion JP joined to the circuit pattern PTH and the circuit pattern PTL of the high potential electrode HT and the low potential electrode LT, respectively, corresponds the other end surfaces of the high potential electrode HT and the low potential electrode LT, and is bonded by a bonding material such as a solder material, for example. It is also possible to bend the tip of each electrode and bond the back surface to the circuit pattern with the bonding material. Similarly, in the output electrode OT, a junction portion JP bonded to the circuit pattern PT may be an end surface or a back surface.

Figure 3:
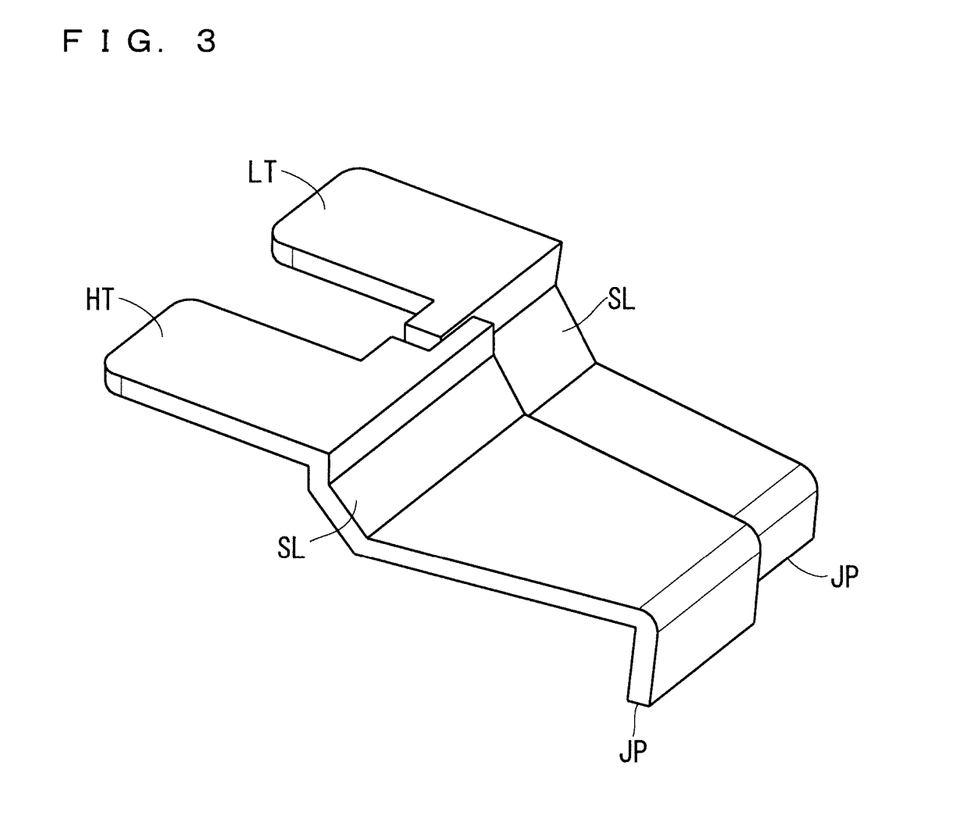
FIG. 3 is a perspective view illustrating a high potential electrode and a low potential electrode incorporated in a resin case.

FIG. 3 is a perspective view illustrating the high potential electrode HT and the low potential electrode LT incorporated in the resin case CS, with the resin case CS omitted. The slope portion SL is provided between an external projection portion exposed on the upper surface of the terminal block TB1 projecting outward from the side wall of the resin case CS of the high potential electrode HT and the low potential electrode LT and an internal projection portion projection inward from the side wall of the resin case CS, and is provided inside of the side wall of the resin case CS.

Figure 4:
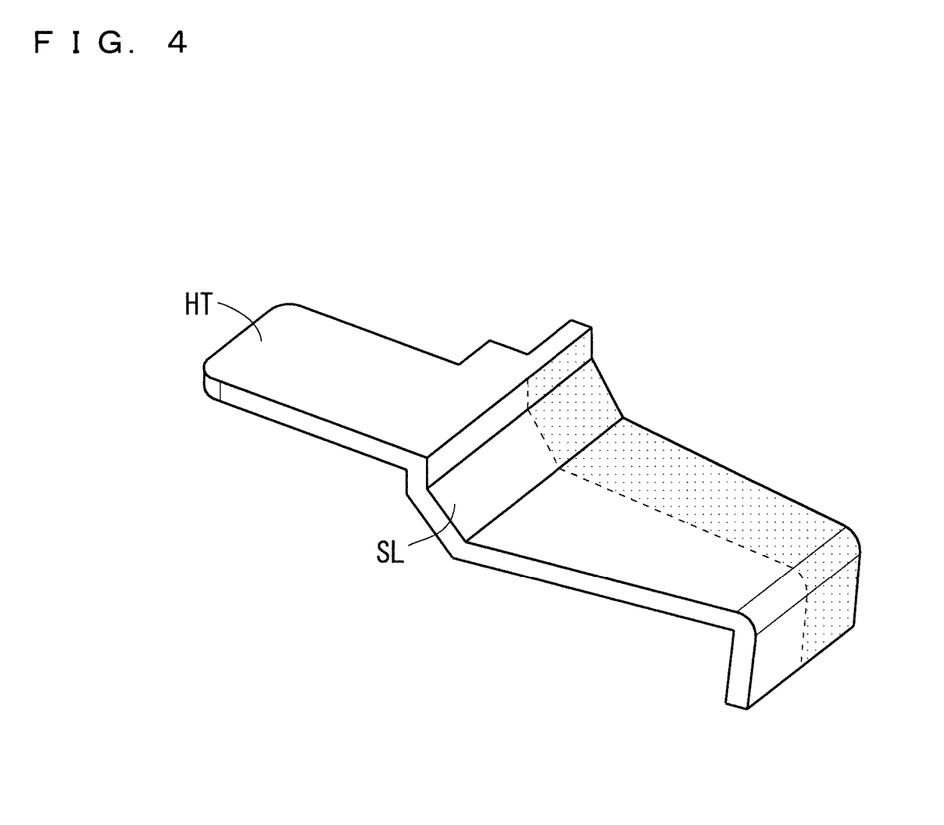
FIG. 4 is a perspective view illustrating the high potential electrode.
Figure 5:
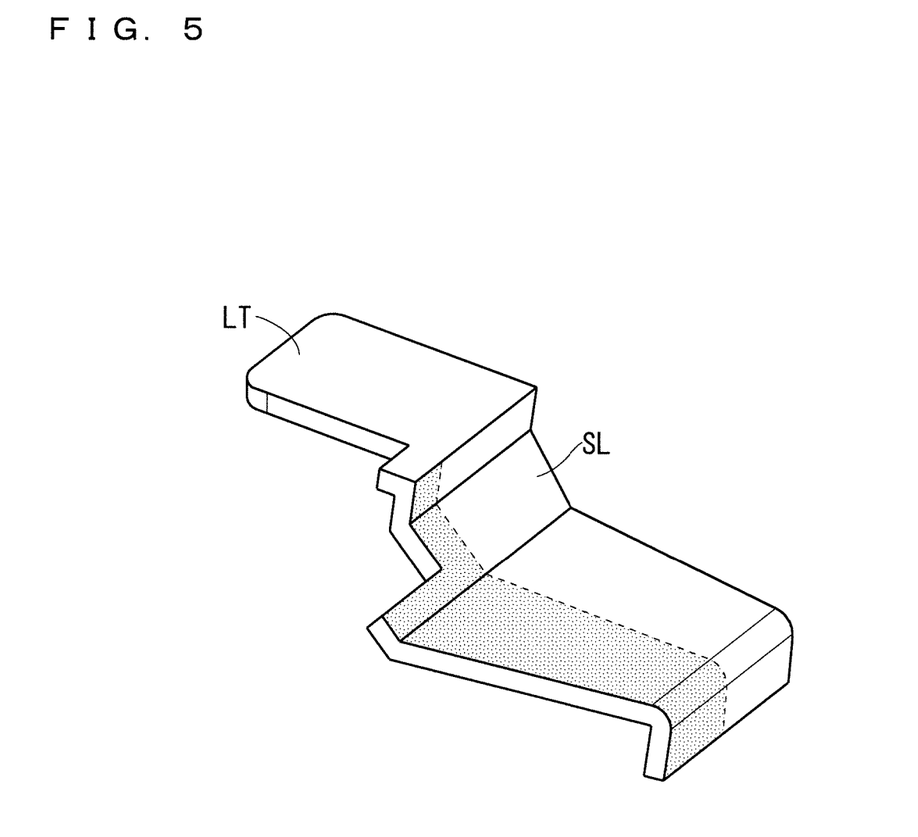
FIG. 5 is a perspective view illustrating the low potential electrode.

FIGS. 4 and 5 are perspective views respectively illustrating the high potential electrode HT and the low potential electrode LT independently, and the respective hatched portions are the portions overlapping each other. By further increasing the overlapping portion, the self-inductance of the semiconductor module 100 can be further reduced.

Figure 6:
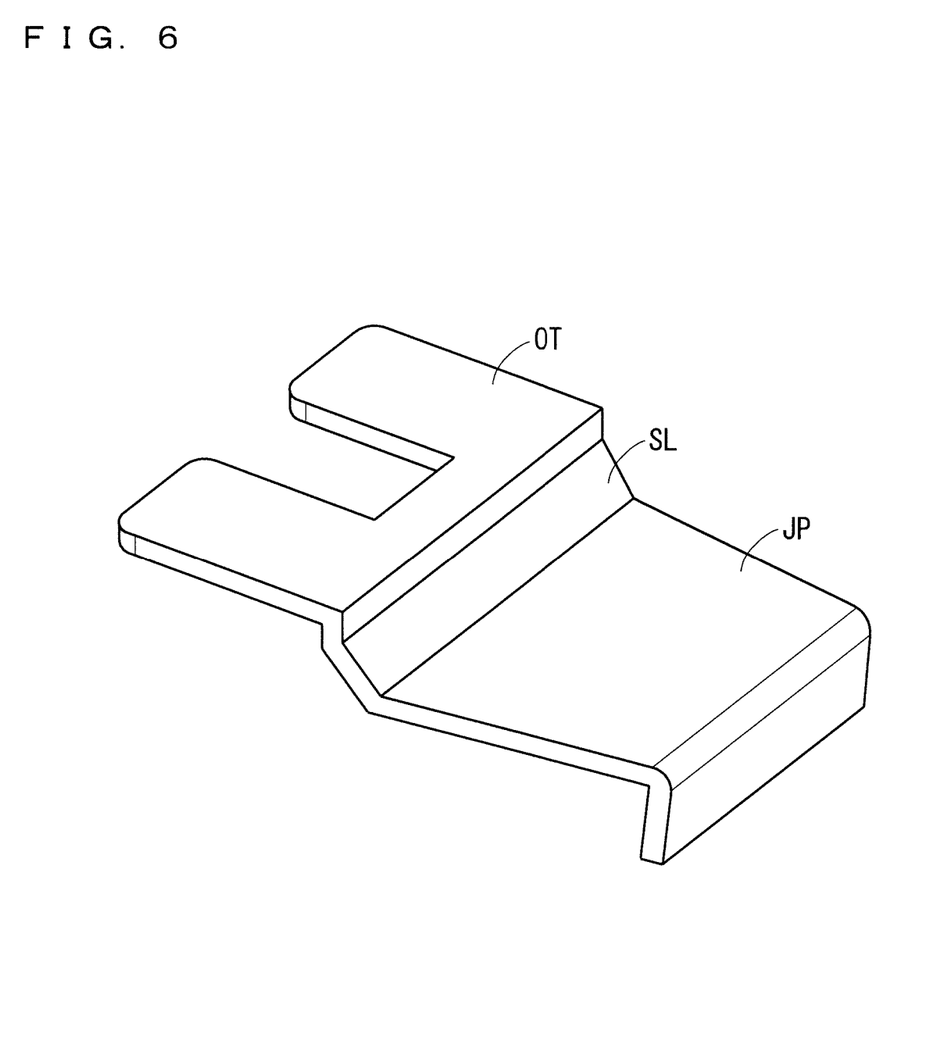
FIG. 6 is a perspective view illustrating an output electrode incorporated in a resin case.

FIG. 6 is a perspective view illustrating the output electrode OT incorporated in the resin case CS, with the resin case CS omitted. The slope portion SL is provided between an external projection portion exposed on the upper surface of the terminal block TB2 projecting outward from the side wall of the resin case CS of the output electrode OT and an internal projection portion projection inward from the side wall of the resin case CS, and is provided inside of the side wall of the resin case CS.

Figure 7:
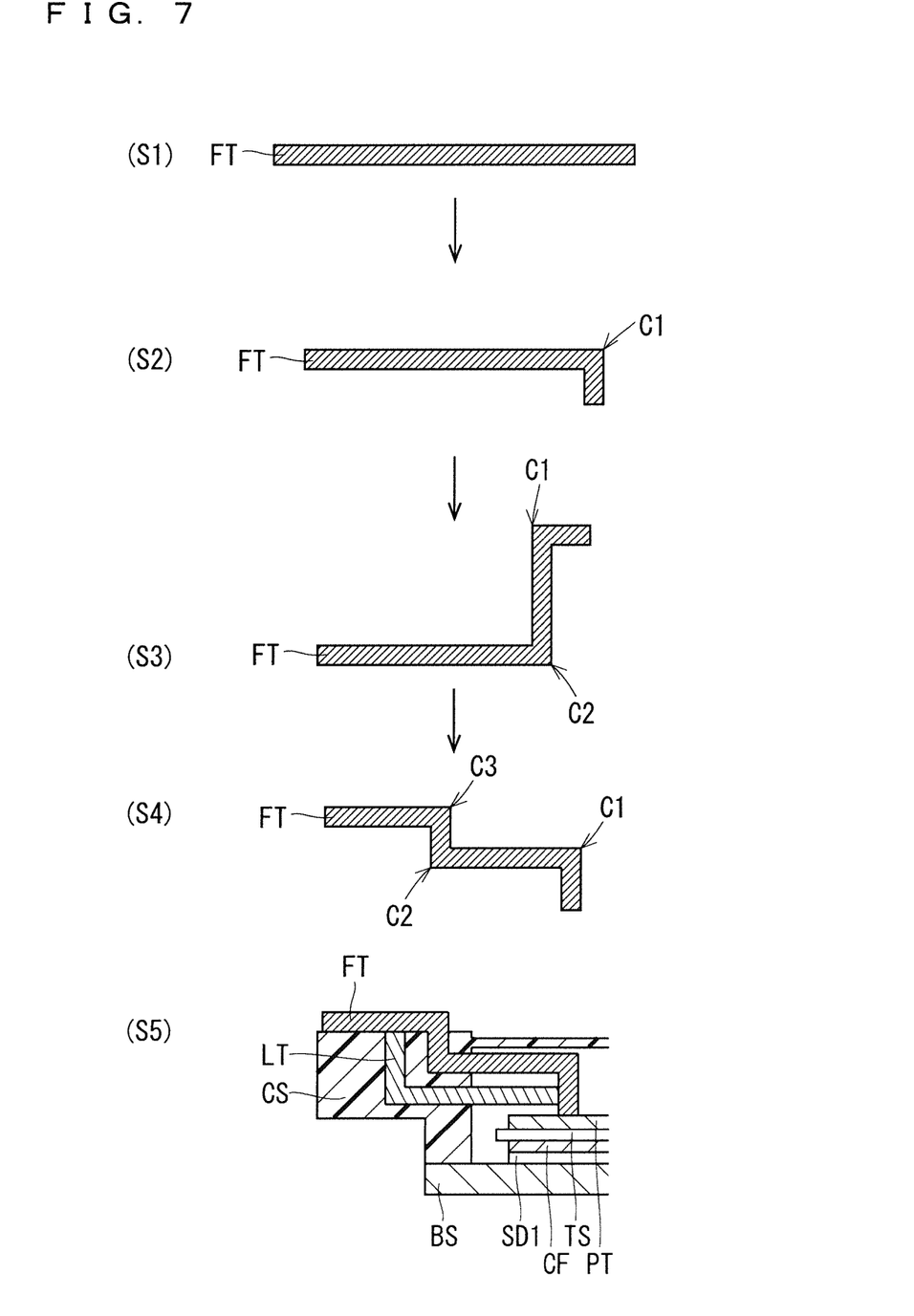
FIG. 7 is a schematic view illustrating a process of bending an electrode when a slope portion is not provided.

FIG. 7 is a schematic view illustrating a process of bending an electrode when a slope portion is not provided, and is illustrated State S5 being a state where the electrode FT is incorporated in the resin case CS, in which the process proceeds through State S1 where the electrode FT is flat, State S2 where one end of the electrode FT is bent at a right angle to form a first right angle portion C1, State S3 where a second right angle portion C2 is formed by bending at a right angle on the front side of the first right angle portion C1 of the electrode FT, and State S4 where a third right angle portion C3 is formed by bending at a right angle on the front side of the second right angle portion C2 of the electrode FT.

Figure 8:
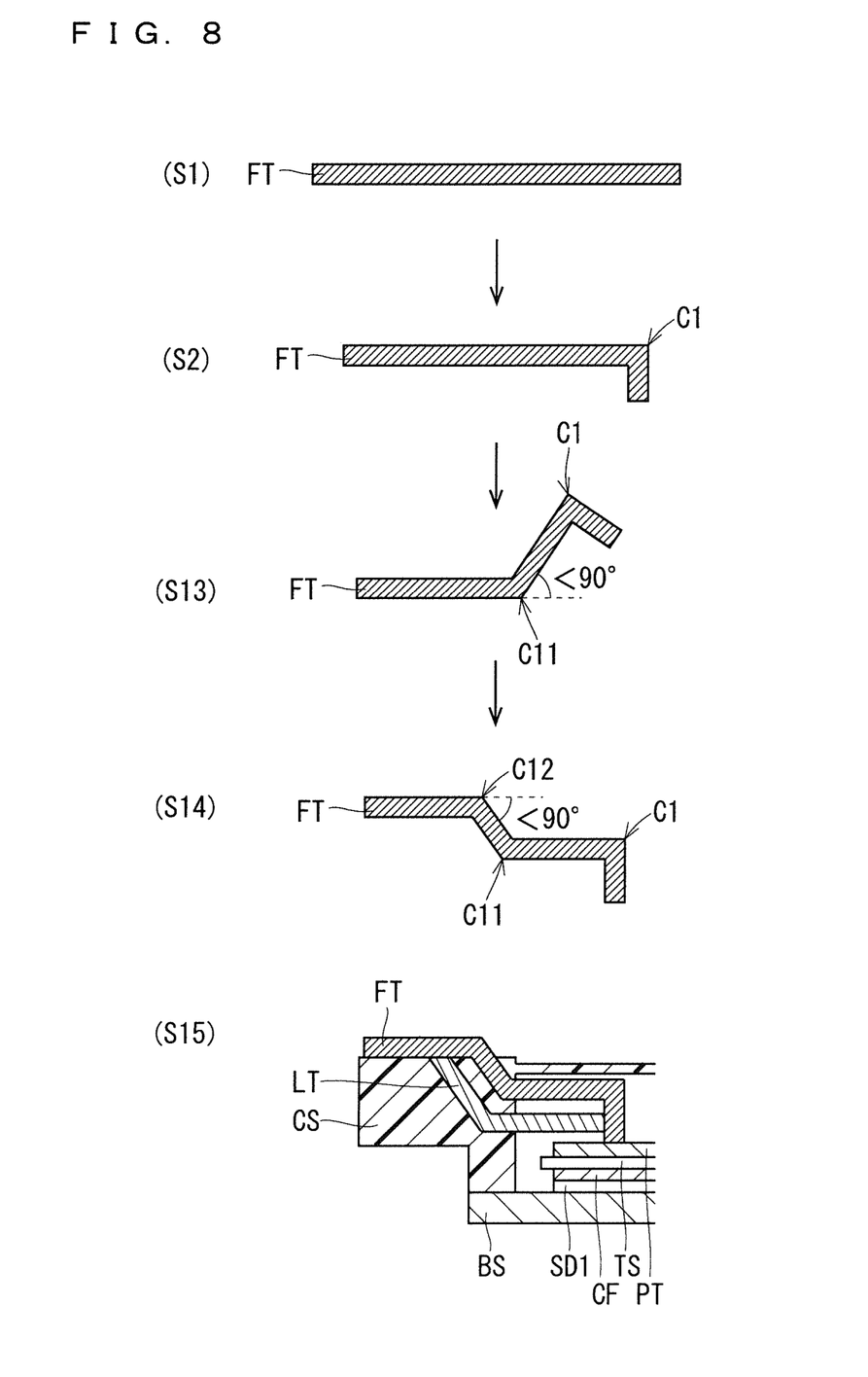
FIG. 8 is a schematic view illustrating a process of bending an electrode when a slope portion is provided.

FIG. 8 is a schematic view illustrating a process of bending an electrode when a slope portion is provided, and illustrating State S1 where the electrode FT is flat, State S2 where one end of the electrode FT is bent at a right angle to form a first right angle portion C1. State S13 where a first obtuse angle portion C11 is formed by bending at an angle of less than 90° from the horizontal state on the front side of the first right angle portion C1 of the electrode FT, State S14 where a second obtuse angle portion C12 is formed by bending at an angle of less than 90° from the horizontal state on the front side of the first obtuse angle portion C11 of the electrode FT, and State S15 being a state where the electrode FT is incorporated in the resin case CS. The electrode FT illustrated in FIGS. 7 and 8 corresponds to the high potential electrode HT.

As illustrated in FIG. 7, the electrode is bent at a right angle at three points in order to form the high potential electrode HT when no slope portion is provided; meanwhile, as illustrated in FIG. 8, the electrode need only be bent at a right angle at one place in order to form the high potential electrode HT when the slope portion is provided. This allows the use of an electrode material having the good workability and a thick thickness; therefore, the current density of the electrode is lowered, the inductance is lowered, and the semiconductor module 100 can be miniaturized.

That is, when the electrode is bent at a right angle (90°) by press working, the required bending stress is proportional to the thickness of the electrode. On the other hand, when bending at an angle of less than 90°, the required bending stress is lower than when bending at a right angle, and empirically, the bending stress may be about half that of bending at 90°. Therefore, from the viewpoint of bending stress, when assuming the same bending stress for bending the electrode at 90° and at 45°, doubling the electrode thickness is allowed for the case when bending at 45° rather than at 90°.

The current density is inversely proportional to the cross-sectional area of the electrode; therefore, when the electrode thickness is doubled, the current density will be halved.

Making the current path short is also important to reduce the inductance. Bending the electrode at less than 90° makes the electrode path shorter than when it is bent at a right angle, which contributes to the reduction in the inductance.

Both the high potential electrode HT, the low potential electrode LT, and the output electrode OT can be embedded in the resin case CS by insert molding. Insert molding is a manufacturing method in which metal members such as electrodes are incorporated into a resin member by injection molding using a vertical type molding machine, and a mold divided into an upper mold and a lower mold is used. A press member such as an electrode is mounted on the lower mold, combined with the upper mold, and the melted resin is injected into the mold and cooled to form the resin member. With this method, the resin case CS in which the high potential electrode HT, the low potential electrode LT, and the output electrode OT are incorporated can be obtained by one insert molding, so that the manufacturing cost of the semiconductor module 100 can be reduced.

Further, the fixed force of each electrode to the resin case CS is improved, and the distance between the electrodes can be shortened, which is effective in reducing the inductance.

The high potential electrode HT and the low potential electrode LT can be inserted into a slit penetrating the resin case CS in the bent state as illustrated in FIGS. 4 and 5 so as to be incorporated into the resin case CS. The slit is provided so as to have a slope portion corresponding to the shape of the slope portion of the high potential electrode HT and the low potential electrode LT.

Embodiment 2

In the semiconductor module 100 of Embodiment 1 described above, although the configuration has been described in which the high potential electrode HT, the low potential electrode LT, and the output electrode OT all are provided with one slope portion SL, each electrode may be provided with a plurality of positions for the slope portions.

Figure 9:
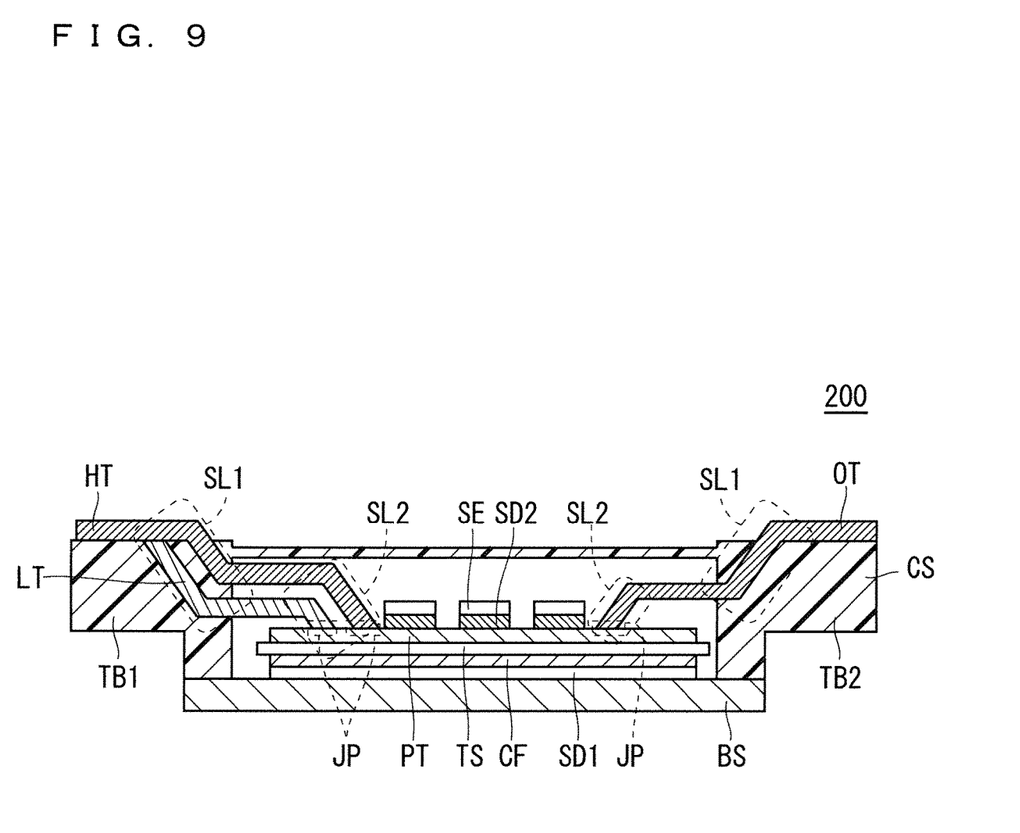
FIG. 9 is a cross-sectional view illustrating a configuration of a semiconductor module according to Embodiment 2.

FIG. 9 is a cross-sectional view illustrating a configuration of a semiconductor module 200 of Embodiment 2, and is a view corresponding to the cross-sectional view in the direction indicated by the arrows along the line A-A in FIG. 1. In FIG. 9, the same components as those of the semiconductor module 100 described with reference to FIGS. 1 and 2 are designated by the same reference numerals, and duplicate description will be omitted.

As illustrated in FIG. 9, in the high potential electrode HT and the low potential electrode LT of the semiconductor module 200, one ends thereof are exposed on the upper surface of a terminal block TB 1 projecting outward from the side wall and the other ends are bonded to the circuit pattern PTH and the circuit pattern PTL, respectively.

The high potential electrode HT and the low potential electrode LT have a slope portion SL1 provided in the side wall of the resin case CS and an internal slope portion SL2 provided in the internal projection portion projecting inward from the side wall of the resin case CS. The slope portion SL1 is the same as the slope portion SL of the high potential electrode HT and the low potential electrode LT of the semiconductor module 100 of Embodiment 1. The slope portion SL2 is provided in front of the junction portion JP in which the high potential electrode HT and the low potential electrode LT are joined to the circuit pattern PTH and the circuit pattern PTL, respectively, and the potion thereof is bent at an angle of less than 90° with respect to the horizontal direction parallel to the base plate BS. Therefore, the contact area with the circuit pattern at the junction portion JP becomes wide.

Also as illustrated in FIG. 9, the output electrode OT also has a slope portion SL1 provided in the side wall of the resin case CS and an internal slope portion SL2 provided in the portion projecting inward from the side wall of the resin case CS. The slope portion SL2 is provided in front of the joint portion JP in which the output electrode OT is joined to the circuit pattern PT, and the potion thereof is bent at an angle of less than 90° with respect to the horizontal direction parallel to the base plate BS. Therefore, the contact area with the circuit pattern at the junction portion JP becomes wide.

As described above, in the high potential electrode HT and the low potential electrode LT, all the bent portions are bent at an angle of less than 90° instead of a right angle, so that the workability of the electrode is further improved and the thicker electrodes are adoptable; therefore, the inductance can be further reduced and the semiconductor module 200 can be miniaturized.

Embodiment 3

Figure 10:
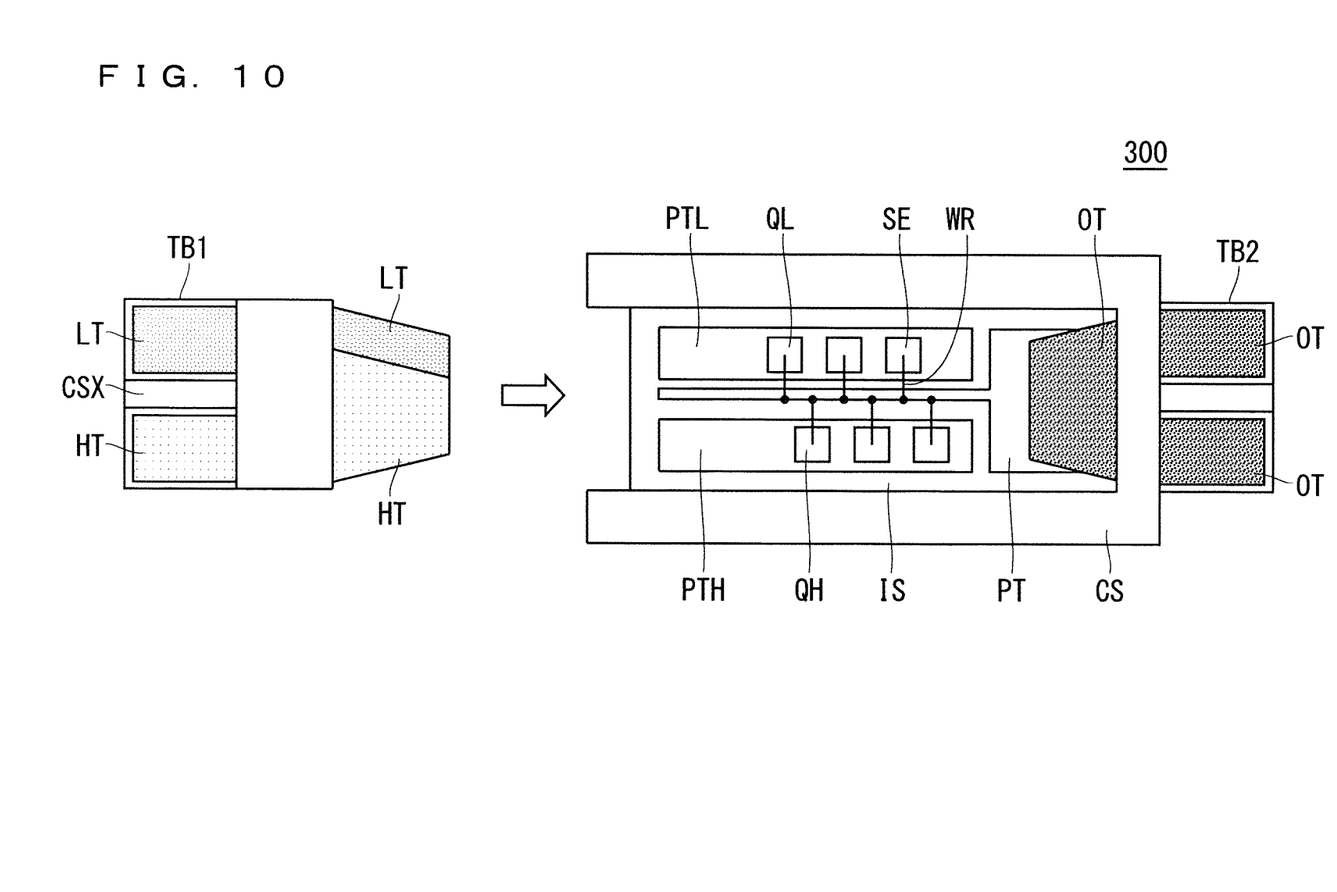
FIG. 10 is a plan view illustrating a method of manufacturing a semiconductor module according to Embodiment 3.
Figure 11:
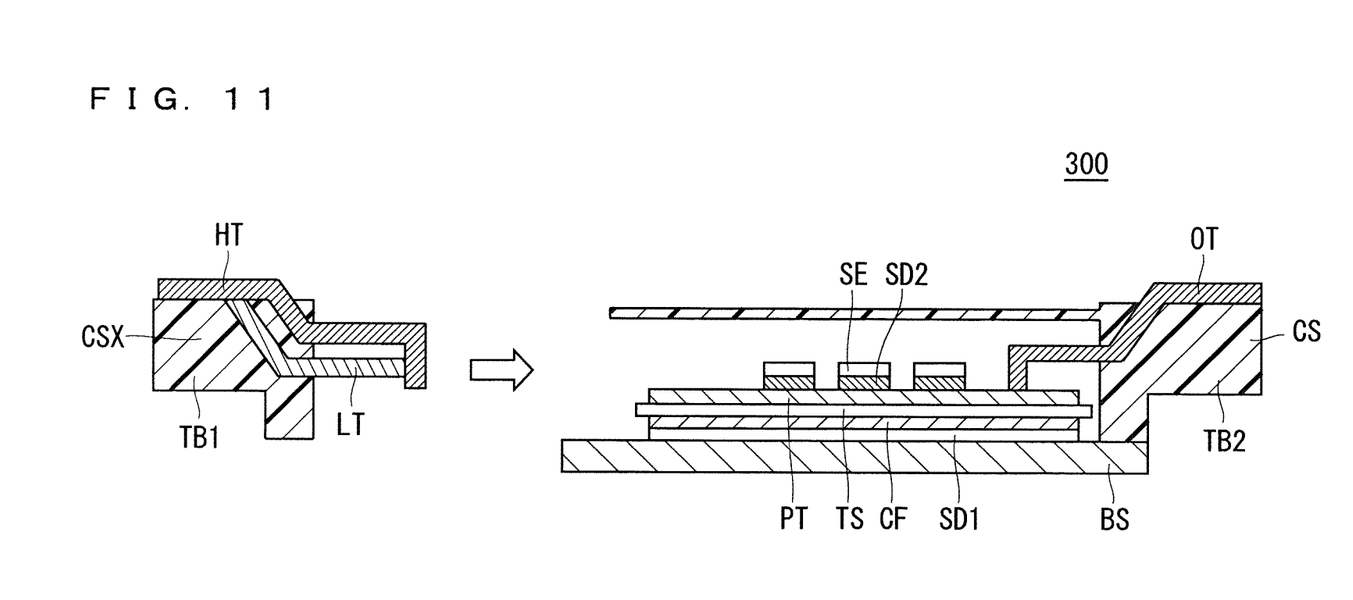
FIG. 11 is a cross-sectional view illustrating the method of manufacturing the semiconductor module according to Embodiment 3.

FIGS. 10 and 11 are a plan view and a cross-sectional view illustrating a method of manufacturing a semiconductor module 300 of Embodiment 3, respectively. Noted that in FIGS. 10 and 11, the same components as those of the semiconductor module 100 described with reference to FIGS. 1 and 2 are designated by the same reference numerals, and duplicate description will be omitted.

As illustrated in FIGS. 10 and 11, the semiconductor module 300 includes a case CS in which the side wall of the case CS in which the high potential electrode HT and the low potential electrode LT are incorporated is formed as a separate body separated from an other part of the case CS and then a side wall CSX of the separate body is joined to the other part of the case CS by adhesive or the like to complete. Therefore, there is a seam between the side wall CSX and the other part.

Although the closer the distance between the electrodes of the high potential electrode HT and the low potential electrode LT is, the smaller the inductance can be, if the electrodes conduct electrically, function as a semiconductor module will be failed, so the processing accuracy of the distance between the electrodes becomes crucial. Therefore, by forming the side wall portion of the case CS in which the high potential electrode HT and the low potential electrode LT are incorporated as a separate body by insert molding, the machining accuracy of the mold of the insert molding can be improved, and the relevant portion can be formed accurately; therefore, the distance between the electrodes can be shortened, and the effect of the reduction in the inductance can be improved.

It should be noted that, in FIGS. 10 and 11, although the configuration has been illustrated in which the output electrode OT is integrated with the other part of the case CS, Embodiment 3 is not limited thereto, and a configuration may also be adopted in which the side wall of the case CS in which the output electrode OT is incorporated is separated as a separate body and then the separate body is joined to the other part of the case CS to complete, in the same manner as the side wall port of the case CS in which the high potential electrode HT and the low potential electrode LT are incorporated. As explained with reference to FIG. 6, the output electrode OT also has a complicated form. Therefore, by forming the side wall portion of the case CS in which the output electrode OT is incorporated as a separate body by insert molding, the machining accuracy of the mold of the insert molding can be improved, the relevant portion can be formed accurately, and the cost of mold manufacturing can be reduced. <Modification>

When the side wall portion of the case CS in which the high potential electrode HT and the low potential electrode LT having a large potential difference are incorporated is formed as a separate body, it can be formed of a resin different from the resin of the other portion of the case CS. For example, by using a resin having a high Comparative Tracking Index (CTI) for the resin in which the high potential electrode HT and the low potential electrode LT having a large potential difference are embedded, creeping discharge is less likely to occur, so that even if the distance between the electrodes is narrowed, insulation can be secured, and the effect of reducing the inductance can be further improved by arranging the high potential electrode HT and the low potential electrode LT closer to each other.

More specifically, a resin having a CTI of 600 or more (600≤CTI) can be used for the side wall portion of the case CS in which the high potential electrode HT and the low potential electrode LT are incorporated, and for the other portion of the case CS, a resin having a CTI of 175 or more and less than 400 (175≤CTI<400) can be used. By using the resin with a CTI of 600 or more, the distance between the electrodes can be more or less halved as compared with the case of using a resin with a CTI of 175 or more and less than 400.

Embodiment 4

Figure 12:
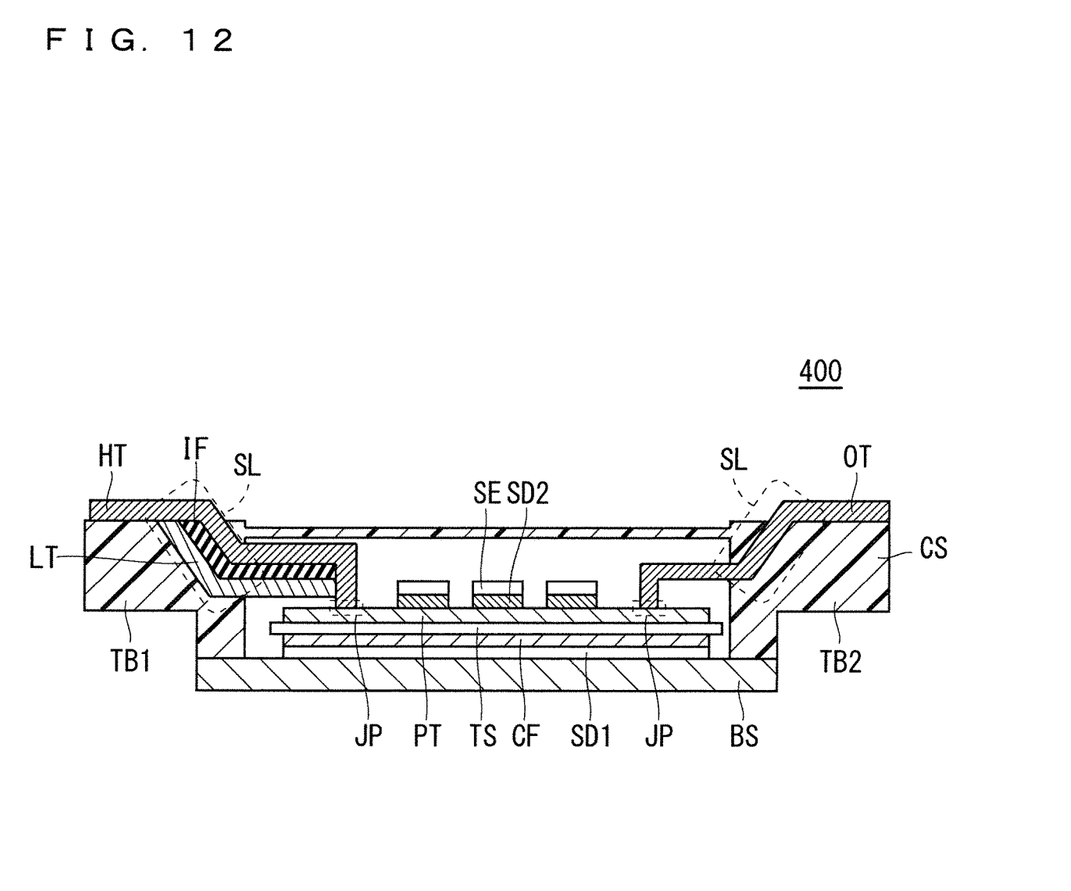
FIG. 12 is a cross-sectional view illustrating a configuration of a semiconductor module according to Embodiment 4.

FIG. 12 is a cross-sectional view illustrating a configuration of a semiconductor module 400 of Embodiment 4, and is a view corresponding to the cross-sectional view in the direction indicated by the arrows along the line A-A in FIG. 1. Noted that in FIG. 12, the same components as those of the semiconductor module 100 described with reference to FIGS. 1 and 2 are designated by the same reference numerals, and duplicate description will be omitted.

As illustrated in FIG. 12, the semiconductor module 400 includes an insulator IF between the high potential electrode HT and the low potential electrode LT. By providing the insulator IF between the electrodes, conduction between the electrodes can be suppressed.

As the insulator IF, a gel-like insulating material or a sheet-shaped insulating material such as insulating paper can be used, and when the gel-like insulating material is used, the gel-like insulating material is filled between the electrodes and then cured; thereby, the space between the high potential electrode HT and the low potential electrode LT is fixed, making subsequent handling facilitated.

When a sheet-shaped insulating material with stable processing accuracy such as insulating paper is used as the insulator IF, a sheet-shaped insulating material molded to match the shape between the two electrodes is placed between the electrodes to fix therebetween; therefore, the distance between the electrodes can be reduced to the thickness of the insulating material, and the inductance of the semiconductor module 400 can be further reduced.

The dielectric breakdown start voltage per unit length of insulating paper is about 3 times higher than that of gel-like insulating material; therefore, the distance between electrodes is reduced to about ⅓ compared to the case of using gel-like insulating material.

<Applicable Semiconductor Element>

In the semiconductor modules 100 to 400 of above-described Embodiments 1 to 4, the constituent material of the semiconductor element SE is not mentioned, however, the constituent material of the semiconductor element SE is composed of a silicon (Si) semiconductor or a silicon carbide (SiC) semiconductor.

A switching element being a silicon carbide semiconductor element composed of a SiC semiconductor has a small switching loss and is capable of high-speed switching operation, however, a surge voltage increases during high-speed switching, and the surge voltage may break the semiconductor element. However, in the semiconductor modules 100 to 400 of Embodiments 1 to 4, the inductance can be reduced, so that the surge voltage at the time of high-speed switching can be suppressed.

In addition, a switching element made of a SiC semiconductor has low power loss and high heat resistance. Therefore, when a power module including a cooling unit is configured, the heat radiating fins of the heat sink can be miniaturized, so that the semiconductor module can be further miniaturized.

Further, a switching element made of a SiC semiconductor is suitable for high-frequency switching operation. Therefore, when applied to an inverter circuit with a high demand for a high frequency, the reactor or capacitor connected to the inverter circuit can be miniaturized by increasing the switching frequency.

Further, the semiconductor element SE is also composed of a wide bandgap semiconductor other than the SiC semiconductor.

The wide bandgap semiconductor other than the SiC semiconductor includes gallium nitride-based materials and diamond. A switching element composed of a wide bandgap semiconductor can be used even in a high voltage region where unipolar operation is difficult with a Si semiconductor, and switching loss generated during switching operation can be greatly reduced. And this reduces the power loss greatly.

In the present disclosure, Embodiments can be combined, appropriately modified or omitted, without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module comprising:
   a semiconductor element;
   a substrate on which the semiconductor module is mounted;
   a heat radiating plate on which the substrate is mounted;
   a resin case accommodating the substrate and the semiconductor element; and
   a first main current electrode and a second main current electrode through which a main current of the semiconductor element flows, wherein
   in the first main current electrode and the second main current electrode, one end of each thereof is joined to a circuit pattern on the substrate, an other end of each thereof is extended through and incorporated in a side wall of the resin case so as to project outward of the resin case, and each thereof has at least a portion of overlap at which a part thereof overlaps in parallel with each other with a gap therebetween, and each thereof has a slope portion provided between an external projection portion with each thereof projecting outward from the resin case and an internal projection portion with each thereof projecting inward from the resin case.

2. The semiconductor module according to claim 1, wherein
   each of the first main current electrode and the second main current electrode has an internal slope portion provided at the internal projection portion thereof.

3. The semiconductor module according to claim 1, wherein,
   of the resin case, the side wall in which the first main current electrode and the second main current electrode are incorporated is provided as a separate body separated from other part of the resin case, and
   the resin case has a seam between the side wall and the other part.

4. The semiconductor module according to claim 3, wherein
   the side wall of the resin case is formed of a resin having a Comparative Tracking Index higher than that of the other part.

5. The semiconductor module according to claim 4, wherein
   the resin of the side wall has the Comparative Tracking Index of 600 or more.

6. The semiconductor module according to claim 1, further comprising
   an insulator provided between electrodes of the portion of overlap of the first main current electrode and the second main current electrode.

7. The semiconductor module according to claim 6, wherein
   the insulator is composed of a cured gel-like insulating material obtained by curing a gel-like insulating material or an insulating paper.

8. The semiconductor module according to claim 1, wherein
   the first main current electrode and the second main current electrode are incorporated in the side wall by insert molding.

9. The semiconductor module according to claim 1, wherein
   the semiconductor element is a silicon carbide semiconductor element.

* * * * *